United States Patent [19]

Honma, deceased et al.

[11] 4,158,567
[45] Jun. 19, 1979

[54] METHOD OF SCREEN GRAVURE PHOTOENGRAVING

[75] Inventors: Kokichi Honma, deceased, late of Wako, Japan, by Kenichiro Honma, legal representative; Yoshio Kameyama, Tokyo, Japan

[73] Assignee: Toppan Printing Co., Ltd., Tokyo, Japan

[21] Appl. No.: 843,558

[22] Filed: Oct. 19, 1977

Related U.S. Application Data

[63] Continuation of Ser. No. 688,038, May 19, 1976, abandoned, which is a continuation-in-part of Ser. No. 486,776, Jul. 9, 1974, abandoned.

[30] Foreign Application Priority Data

| Jul. 9, 1973 | [JP] | Japan | 48-73349 |
| Jun. 6, 1974 | [JP] | Japan | 49-64465 |
| Jun. 14, 1974 | [JP] | Japan | 49-67700 |
| Jun. 14, 1974 | [JP] | Japan | 49-67701 |

[51] Int. Cl.² .......... G03C 5/00; G03F 7/00; G03F 5/00
[52] U.S. Cl. .......... 96/36.3; 96/38; 96/45; 156/660; 156/905
[58] Field of Search .......... 96/36.3, 36.4, 38, 45; 101/150, 170; 156/660, 905

[56] References Cited

U.S. PATENT DOCUMENTS

| 2,543,393 | 2/1951 | Wheldon | 96/38 |
| 3,179,519 | 4/1965 | Velten et al. | 96/38 |
| 3,281,131 | 11/1966 | Jemseby | 96/38 |
| 3,325,285 | 6/1967 | Harris et al. | 96/38 |
| 3,375,111 | 3/1968 | Verdooner et al. | 96/38 |
| 3,597,077 | 8/1971 | Dorn | 96/45 X |
| 3,770,435 | 11/1973 | Volkert | 96/45 |
| 3,829,315 | 8/1974 | Schadlich et al. | 96/45 |
| 4,059,481 | 11/1977 | Nagano | 96/38 X |

*Primary Examiner*—Edward C. Kimlin
*Attorney, Agent, or Firm*—Lerner, David, Littenberg & Samuel

[57] ABSTRACT

An improved method of screen gravure photoengraving using a half-tone positive in which the gradation is fully represented by the variations of both sizes and depths of ink cells formed in the printing plate and the formation of moire pattern can be prevented without requiring strict registering in exposure steps, and the method comprises the steps of, for example, exposing a photosensitive material such as a carbon resist to a light source through a gravure screen having transparent crosslines, further exposing the photosensitive material to the light source through a half-tone positive, again exposing to the light source by interposing a diffusion sheet between the half-tone positive and the photosensitive material, then transferring thus exposed photosensitive material on a gravure cylinder and carrying out developing and etching.

6 Claims, 29 Drawing Figures

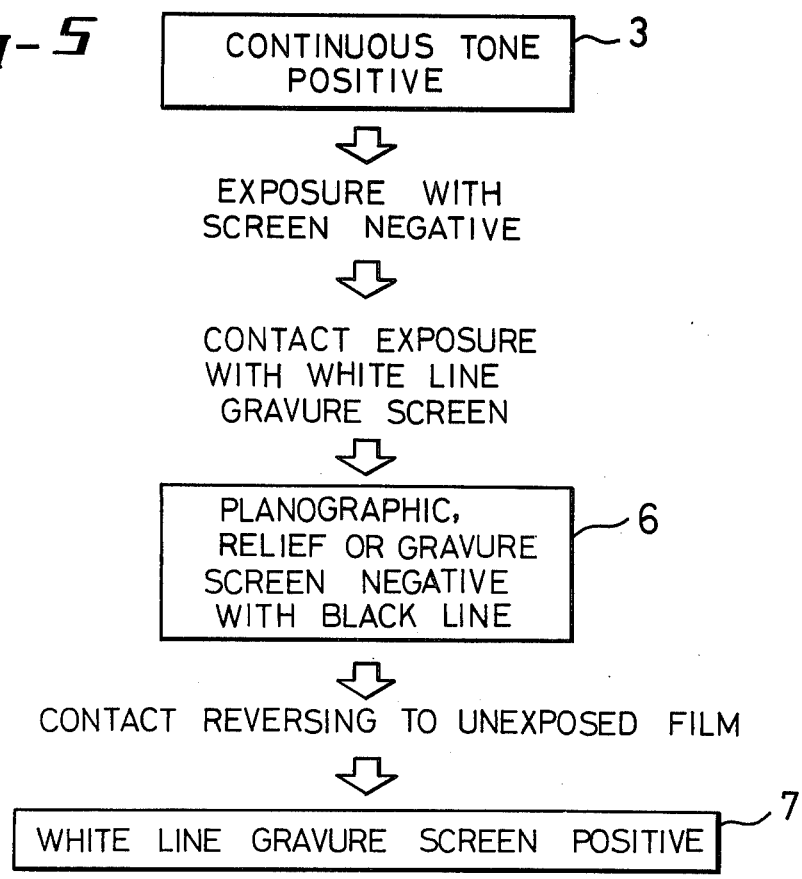
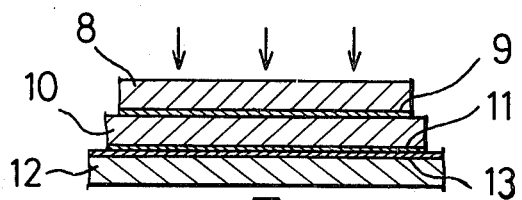

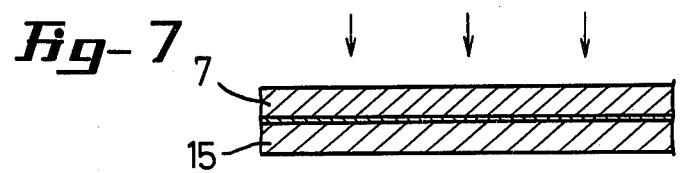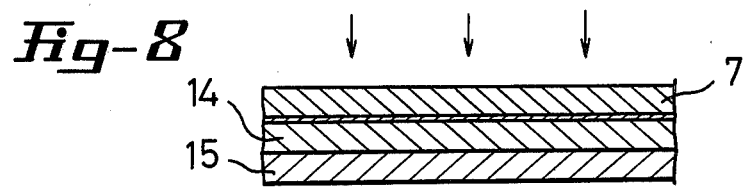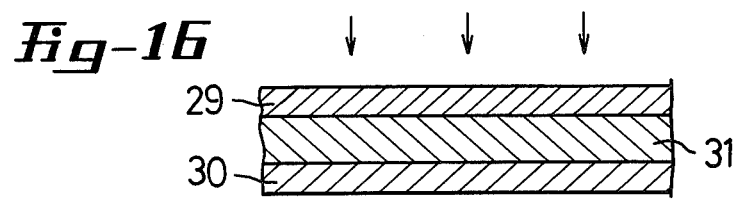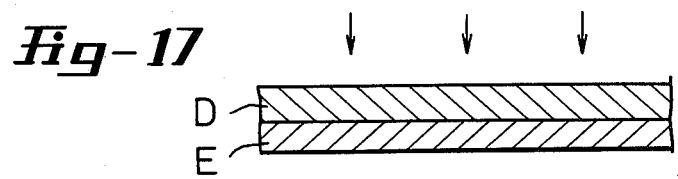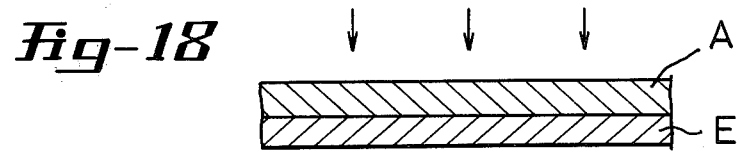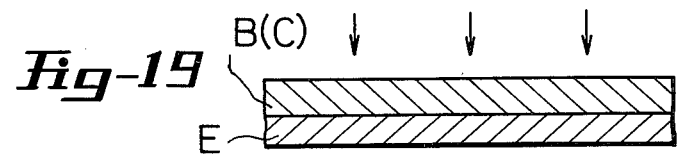

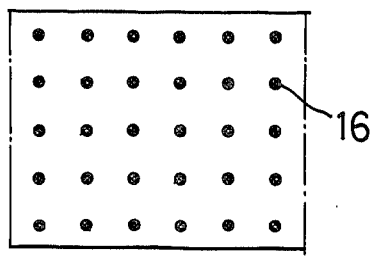
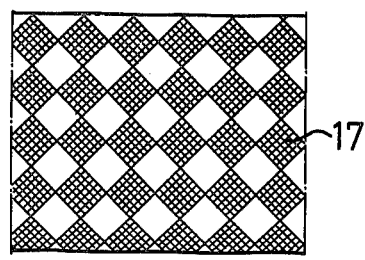
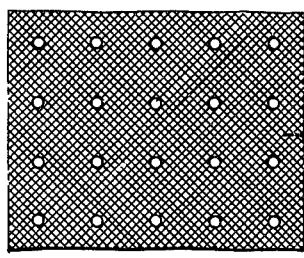
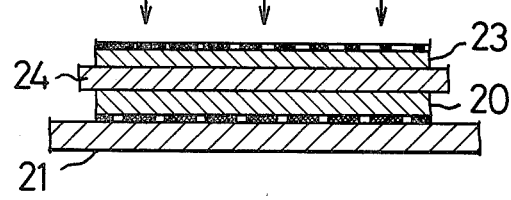
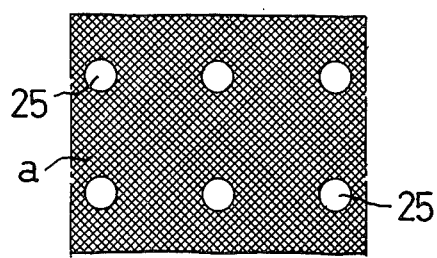
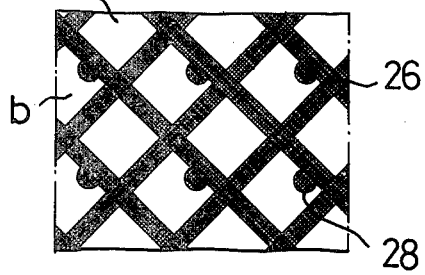

METHOD OF SCREEN GRAVURE PHOTOENGRAVING

CROSS-REFERENCE TO RELATED APPLICATION

This is a continuation, of application Ser. No. 688,038, filed May 19, 1976, now abandoned, which is a continuation-in part of application Ser. No. 486,776 filed July 9, 1974, now abandoned.

BACKGROUND OF THE INVENTION (1) Field of the Invention

This invention relates to an improved method of screen gravure photoengraving which can be utilized for the photogravure printing process.

More particularly, the invention relates to an improved screen gravure photoengraving method in which several photosensitive materials and half-tone positives can be used.

Furthermore, the invention relates to an improved screen gravure photoengraving method in which excellent gravure printings with wide gradation and good reproducibility are produced.

(2) Description of Prior Art

In the ordinary gravure photoengraving methods, the conventional gravure method and the screen gravure method are generally known. In the conventional gravure method, the density gradation is represented by the variation of depths of ink cells formed in a printing plate, while in the latter screen gravure method, the density gradation is represented by the variation of sizes of ink cells or by the variation of both the sizes and depths of ink cells.

In the conventional gravure photoengraving process, several kinds of etching solutions are necessary for etching a printing plate through a layer of photosensitive material since the gradation must be represented only by the depths of ink cells formed in the printing plate. The screen gravure method, that is the so-called intaglio half-tone gravure method, is an improvement of the former conventional method, however, when the gradation of an original is represented only by the variation of the sizes of ink cells, the gradation of resultant prints is not satisfactory and the tone of the original picture can not be well reproduced. While, in the method utilizing the combination of both size and depth variations of ink cells, the influence of deviation in depths can be reduced because the factor of cell size is added, so that the latter method is preferable in view of reproducibility.

However, in the known method called as double positive method, though the ink cells are varied in both the sizes and depths, two kinds of positives such as a gravure half-tone positive and a continuous tone positive must be used. That is, in this process, a photosensitive material such as carbon resist is firstly exposed to a light source through a half-tone positive to form half-tone dots, then it is further exposed to the light through a continuous tone positive to give the variation of depths of the half-tone dots, thereafter a printing plate is formed through the steps of transferring, developing and etching. In this process, it is necessary to register completely the half-tone positive with the continuous tone positive, which is substantially difficult, and in addition, the process of exposure is complicated. Accordingly, very high skill is required for this process.

BRIEF SUMMARY OF THE INVENTION

The present invention, therefore, provides an improved method for eliminating the above-mentioned disadvantages, in which the continuous tone positive is not necessarily used, and the variation of sizes and depths of ink cells can be attained by using only a half-tone positive. Further, any of half-tone positives for gravure printing, planographic printing and relief printing can be used in the method of the present invention.

The first object of the present invention is to provide an improved method of screen gravure photoengraving using a half-tone positive which comprises the steps of: exposing a photosensitive material to a light source through a gravure screen having transparent crosslines, again exposing the photosensitive material to the light source through the half-tone positive, further exposing the photosensitive material to the light source by interposing a diffusion sheet between the half-tone positive and the photosensitive material, and succeeding plate making steps. The order of the above exposure steps is not fixed.

The second object of the present invention is to provide an improved method of screen gravure photoengraving which comprises the steps of: exposing a photosensitive material to a light source through a half-tone positive having transparent crosslines of gravure screen, further exposing the photosensitive material to the light source by interposing a diffusion sheet between the half-tone positive and the photosensitive material, and succeeding plate making steps.

The third object of the present invention is to provide an improved method of screen gravure photoengraving which comprises the steps of: exposing a photosensitive material to a light source by placing thereon a gravure screen and further placing on the gravure screen the layers of the half-tone negative and a diffusion sheet, exposing the photosensitive material to the light source through a half-tone positive, further exposing the photosensitive material to the light source by interposing a diffusion sheet between the half-tone positive and the photosensitive material, and succeeding plate making steps. The above layers of a half-tone negative and a diffusion sheet can be replaced by a continuous tone negative.

The fourth object of the present invention is to provide an improved method of screen gravure photoengraving which comprises the steps of: exposing a photosensitive material to a light source through a gravure screen, exposing again the photosensitive material to the light source through a half-tone positive having none of transparent crosslines of gravure screen, exposing further the photosensitive material through a continuous tone positive or an approximately continuous tone positive.

Exemplified as the above-mentioned half-tone positives are planographic half-tone positives, relief half-tone positives and gravure half-tone positives, which are used in the conventional plate making processes of planographic, relief and gravure printing. The planographic half-tone positives and relief half-tone positives have none of transparent crosslines, while the gravure half-tone positives have desired number of transparent crosslines.

Exemplified as the above-mentioned photosensitive materials are carbon resists such as carbon tissue; gravure resist films such as the film sold by E. I. du Pont de Nemours & Co, under the name "Rotofilm;" and layers of photosensitive resin such as "Sonne KPM2000" (trademark) sold by Kansai Paint Co., Ltd., formed on gravure cylinders. When a carbon resist is used as the photosensitive material, the aforementioned succeeding plate making steps comprise the steps of: transferring the exposed carbon resist on a gravure cylinder, developing the carbon resist and etching the gravure cylinder through the carbon resist. When a gravure resist film is used as the photosensitive material, the succeeding plate making steps comprise the steps of: developing firstly the exposed gravure resist film with developing agents, transferring then the resist film on a gravure cylinder, again developing with hot water and etching the gravure cylinder through the gravure resist film. When the photosensitive resin layer formed on a gravure cylinder is used, the succeeding plate making step is only the development of the resin layer itself.

Incidentally, the above-mentioned exposure steps can be performed in any order since a single photosensitive material is repeatedly exposed to the light source without any effect of the order of exposures.

BRIEF DESCRIPTION OF THE DRAWINGS

These and other features of the present invention will be more fully understood by referring to the following detailed description presented solely for the purpose of illustration and to the accompanying drawings, in which:

FIGS. 1 to 4 are enlarged schematic illustrations of photosensitive materials showing the principle of the method to attain the first object of the present inventon, where

FIG. 5 to FIG. 8 are diagram or schematic views of the method for attaining the second object of the present invention, in which FIG. 5 is a block diagram for preparing a gravure half-tone positive, FIG. 6 is an enlarged cross-sectional view of layers of materials in the preparation of the gravure half-tone positive, FIG. 7 is a cross-sectional view of the layers of materials in the second step of the above method, and FIG. 8 is also a cross-sectional view of the layers of materials in the third step of the method;

FIG. 9 to FIG. 15 are schematic illustrations showing the method for attaining the third object of the present invention, in which FIG. 9 is an enlarged plan view of a highlight portion of a half-tone positive showing the state of half-tone dots, FIG. 10 is also an enlarged plan view in a middle tone portion of the half-tone positive, FIG. 11 is also an enlarged plan view of a shadow portion of the half-tone positive, FIG. 12 is an enlarged cross-sectional view showing the first step of the method for attaining the third object of the present invention, FIG. 13 is an enlarged cross-sectional view showing the other variation of the step as shown in FIG. 12, FIG. 14 is an enlarged plan view of the highlight portion which is formed in the second step, and FIG. 15 is an enlarged plan view of the shadow portion formed in the second step; and FIG. 16 to FIG. 19 are schematic illustrations showing the other method for the fourth object of the present invention, in which FIG. 16 is an enlarged cross-sectional view of the layers of materials for preparing an approximately continuous tone positive, FIG. 17 is an enlarged cross-sectional view showing the state of contact printing in the first step of the fourth method, FIG. 18 is an enlarged cross-sectional view showing the state of contact printing in the second step, and FIG. 19 is also an enlarged cross-sectional view showing the state of contact printing in the third step of the fourth method of the present invention.

DETAILED DESCRIPTION OF THE INVENTION

Figure 1A:
FIG. 1(a) is a plan view of a part of carbon resist being exposed to a light source by contacting it with a gravure screen.
Figure 1B:
FIG. 1(b) is a cross-sectional view of the carbon resist shown in FIG. 1(a)
Figure 2A:
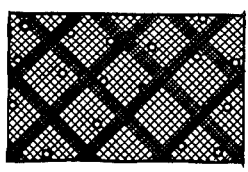
FIG. 2(a) is a plan view of the above-mentioned carbon resist which is exposed to a light source by contacting it with the highlight portion of a half-tone positive.
Figure 2B:
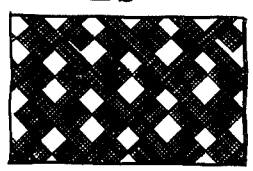
FIG. 2(b) is a plan view of the carbon resist like FIG. 2(a) in 50% density portion.
Figure 2C:
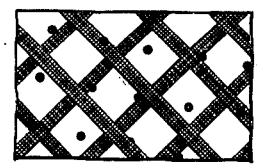
FIG. 2(c) is also a plan view like FIG. 2(a) in the shadow portion.
Figure 2D:
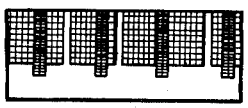
FIG. 2(d) is a cross-sectional view of the carbon resist shown in FIG. 2(a)
Figure 2E:
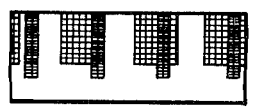
FIG. 2(e) is a cross-sectional view of the carbon resist shown in FIG. 2(b)
Figure 2F:
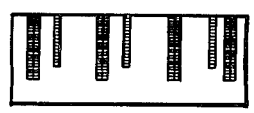
FIG. 2(f) is also a cross-sectional view of the carbon resist shown in FIG. 2(c)

In the following, the fundamental method to carry out the first object of the present invention will be described. In the first step of this method, a photosensitive carbon resist is exposed to a light source through a gravure screen that has desired number of transparent crosslines (See FIG. 1). As the above carbon resist, other photosensitive materials such as those disclosed above may be of course used. The sensitization of the carbon resist is carried out by immersing the carbon resist into a potassium bichromate solution and drying it thereafter. Further, the gravure screen having transparent lines used in the conventional method may be employed in the present invention. The mesh of the gravure screen may be 150, 175, 200, 250 or 300 lines per inch, or so.

The above gravure screen and the carbon resist are inserted into a vacuum frame and are exposed to a light source. The light source for this exposure may be an arc lamp, mercury lamp, xenon lamp, metal halide lamp or the like.

In the case that a half-tone positive in which the half-tone dots in the middle tone to shadow portion are continuous such as those of planographic half-tone positive or relief half-tone positive, is used, the continuous portion is provided with the image of gravure screen lines by the above-mentioned exposure with a gravure screen in the first step so as to prevent the flow of printing ink in the range of middle tone to shadow portion. If the half-tone dots are isolated from one another in the shadow portion like a gravure half-tone positive, this exposure step with the gravure screen can be omitted.

Then, in the second step, the above-mentioned carbon resist which has been exposed to a light source through the gravure screen in the first step is further exposed by using the above-mentioned half-tone positive. (See FIG. 2)

The half-tone positive as employed in this step may be any of those for gravure printing, planographic printing or relief printing, and the exposure can be carried out in like manner as the above first step.

This half-tone positive exposure in the second step is carried out in order to form half-tone dots which vary in the respective dimensions.

Figure 3A:
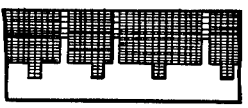
FIG. 3(a) is a cross-sectional view of the carbon resist in the highlight portion which is obtained by exposing it with the insertion of a diffusion sheet between a half-tone positive and the carbon resist.
Figure 3B:
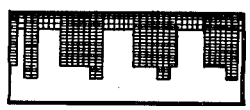
FIG. 3(b) is a cross-sectional view of the carbon resist like FIG. 3(a) in 50% density portion.
Figure 3C:
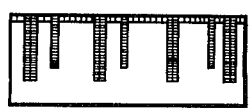
FIG. 3(c) is also a cross-sectional view of the carbon resist like FIG. 3(a) showing the shadow portion.

In the next third step, a diffusion sheet is placed between the above half-tone positive and the carbon resist that is exposed in the foregoing steps, and the half-tone positive is printed again through the diffusion sheet. (See FIG. 3)

The above-mentioned diffusion sheet makes a space between the half-tone positive and the carbon resist according to the thickness of diffusion sheet and also exerts diffusion effect. As the materials having diffusion effect, there are exemplified a high quality mat film, opal glass, super fine frosted glass and the like, and the exposure can be carried out in like manner as the foregoing first and second steps.

In this diffusive exposure of the third step, the light rays passed through the portions other than the half-tone dots of the half-tone positive are diffused by the diffusion effect of the diffusion sheet and the existence of the space between the half-tone positive and the carbon resist, thus the carbon resist under the half-tone dots is also exposed to some extent in accordance with the sizes of the respective half-tone dots, which varies the depth of the half-tone dots and also makes the formation of moire pattern imperceptible. In this step, the obtained density curve can be controlled by regulating the rate of diffusion depending upon the kind and thickness of the diffusion sheet and the amount of exposure. By the way, it should be noted that the above-mentioned steps from the first to third can be carried out in optional order.

Figure 4A:
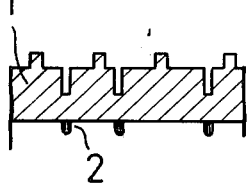
FIG. 4(a) is a cross-sectional view of the highlight portion showing the state after transferring, developing and etching on a copper gravure cylinder.
Figure 4B:
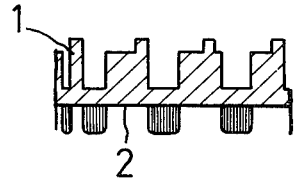
FIG. 4(b) is a cross-sectional view like FIG. 4(a) in 50% density portion and FIG. 4(c) is a cross-sectional view like FIG. 4(a) in the shadow portion.
Figure 4C:
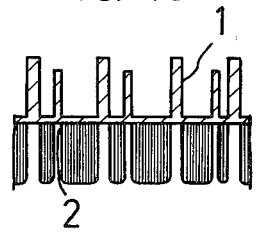

Then, in the fourth step, the exposed carbon resist 1 formed in the preceding steps is transferred on the surface of a gravure cylinder 2 and then etched to form a gravure printing plate (See FIG. 4)

The fourth step of this method may be carried out in accordance with the conventional method, in which the exposed carbon resist 1 is fitted on the surface of a prepared gravure cylinder 2 at its predetermined position with a proper supply of water. After this transferring of the carbon resist, uncured gelation is washed away by dipping it into hot water to develop the image, and it was then dried. Through the above process, the half-tone dots of gelation resist having various dimensions and thicknesses are formed according to the tone density of the half-tone positive.

In the next step, the surface of the cylinder 2 is etched through the remaining gelatin film by using an etching solution containing ferric chloride, and after the etching to be desired depth, if necessary, the etched surface may be applied with chromium plating in order to increase the durability for printing.

In the method of the present invention for the aforementioned first object, the gravure printing plate having half-tone dots of different dimensions and depths can be formed by using a half-tone positive without the necessity of the continuous tone positive, therefore the photographing step and printing step in the conventional double positive method can be simplified and facilitated. Further, fine gravure printings with good reproducibility and excellent density gradient can be produced because the ink is transferred by the combination effect of size and depth of the each ink cell. Further, the gradient is subject to little influence of deviation of etching action, so that the reproducibility becomes stable and the control of the etching step becomes easy.

Still further, in the method of the present invention, not only the half-tone positive for gravure printing but also those for planographic printing and for relief printing can be used. So that, for example, when a planographic half-tone positive which is formed directly from the original is used, the conventional screen gravure printing method in which the half-tone positive is formed by using double positives method, can be simplified to a great extent, which facilitates the process and reduces the cost. Furthermore, the range of density gradation of the half-tone positive for planographic printing is larger than that of the half-tone positive for gravure printing, so that excellent and stable printing plate and printed matter can be produced by using a planographic half-tone positive.

In the following, the screen gravure photoengraving method of the second object of the present invention will be explained in detail, in which a half-tone positive with transparent lines is prepared as the first step. The following two methods are exemplified for the preparation of such half-tone positives.

In the first example which is shown in FIG. 5, double exposure is carried out by using a process camera or a printer by conducting half-tone negative exposure of photosensitive film through a continuous tone positive film 3, and further exposing it by contacting it with a gravure screen. Then, it is developed to obtain a half-tone negative 6 with black lines. It is further reversed by contacting it with an unexposed film to form a half-tone positive with transparent lines. In another example as shown in FIG. 6, the half-tone negative 10 is put in layers with a black line screen 8, and unexposed film 12 is placed under the layers, and the exposure is carried out to obtain a half-tone positive with transparent lines.

In the preparation of the above half-tone positive 7 with transparent lines, in order to minimize the formation of moire pattern by the intersection of the half-tone dots of the half-tone negative 6 or 10 and the gravure screen lines, it is necessary to dispose the half-tone negative film 6 or 10 and the gravure screen lines with a certain angle. For example, when a half-tone positive of 175 lines per inch and a screen of 250 lines per inch are used, the intersection angle may be 80 to 85 degrees in the case of a yellow plate.

As the gravure screens for the method of the present invention, commonly used screens of 150, 175, 200, 250 and 300 lines per inch can be used, and when they are employed, the angular deviation must be determined according to the screen number in order to prevent the occurrence of moire pattern.

In the second step, the half-tone positive 7 obtained in the above first step is held in contact with a photosensitive carbon resist 15 and exposed to a light source. (See FIG. 7)

The exposure with the half-tone positive 7 in this second step is carried out in order to form half-tone dots having screen lines, and the latent images of the half-tone dots in the middle tone to shadow portion which are separated individually by the screen lines are formed.

In the next third step as shown in FIG. 8, diffusion sheet 14 is inserted between the above-mentioned half-tone positive 7 and the carbon resist 15 of the second step, and the half-tone positive 7 is printed again through the diffusion sheet 14.

During this diffusive exposure of the third step, the light passed through the portions other than the half-tone dots of the half-tone positive is diffused by the small space between the half-tone positive 7 and the carbon resist 15 and also by the diffusion effect of the diffusion sheet 14, so that the effect of an approxiately continuous tone positive can be obtained by the gradation effect, and the degree of curing of the carbon resist 15 is varied in accordance with the density of the half-tone positive. As the result, the thickness of the carbon resist 15 after development is varied to provide the variation of the depths of half-tone dots, therefore, during the process for making the photogravure printing plate by etching the copper cylinder through the film of carbon resist 15, the depths of ink cells on the printing plate are varied.

By the above gradation effect of the exposure through the diffusion sheet 14, the formation of moire can be made imperceptible simultaneously with the changing of the depths of half-tone dots.

The gradation of reproduced tone can be controlled by regulating the length and intensity of the exposure and selecting the kind, thickness and diffusivity of the diffusion sheet 14.

In the succeeding fourth step, the carbon resist 15 which has been exposed to a light in the second and third steps is transferred on the surface of a gravure cylinder and etched to form a screen gravure printing plate.

According to the above method for the second object of the present invention, there is no necessity of the continuous tone positive that is used in the prior art for printing to the carbon resist, and the sizes and depths of half-tone dots can be controlled by using only a half-tone positive having transparent crosslines. Further, the conventional photographing step and exposing step in the double positive method can be simplified. Furthermore, the density is represented by the combination of the dimensions and depths of the ink cells, so that the range of density gradation is widened to produce excellent prints and the reproduced tone becomes very stable without substantial influence of the fluctuation of etching effect in the etching step, which facilitate the controlling of the etching step.

Still further, according to this method of the present invention, the countermeasure against the formation of moire can be taken in the step to prepare the half-tone positive 7 having transparent crosslines, so that the adjustment of screen angle in the gravure plate making becomes almost unnecessary. Accordingly, the efficiency of the printing work which formerly accompanying the angle regulation can be enhanced, and the poor contact of screen owing to the clinging of dust in the air to the surface of the carbon resist and blurring of the screen can be easily prevented, so that, overall efficiency of the work can be very much improved.

In the following, the method for attaining the third object of the present invention will be explained. In this method, the formation of moire can be prevented, in which a half-tone positive used for any of planographic, relief and gravure printing can be used.

As disclosed in the foregoing, the tone of the original is reproduced by varying the depths of ink cells in the conventional gravure photoengraving, accordingly, in the etching step after the transferring of the carbon resist, several kinds of etching solutions must be used separately in order to form ink cells. In this case, it is very difficult to form the ink cells with an accuracy in the degree of about 1 micron in depth by using several kinds of etching solutions in consideration to the thickness of the resist. For example, when the highlight portion of the original is to be etched with a depth of 2 microns, if a gravure screen of 175 lines per inch and line ratio of 1:2.5 is used, the volume of ink in an ink cell becomes:

$$(10^4\mu)^2 \times 2\mu = 2 \times 10^4 \mu^3 (=2 \times 10^{-5} mm^3)$$

In the case that an error of 0.5 micron in depth is caused to occur, the reproducibility of the ink density becomes 75% to the aimed value. In the conventional method, the yield rate is poor because it is difficult to etch with the accuracy in the degree of 0.5 micron. There is a screen gravure method for removing the above disadvantages, however, the gradation is represented by only the variation of the sizes of half-tone dots with a constant cell depth, which is insufficient for representing the gradation of the original as being well known in the art of this field.

In contrast to the above, when the combination of the variation of sizes and depths of the half-tone dots is employed, the error in the depths during the etching step does not cause so much deviation in the tone of the print because the variation of the half-tone dots in the size is also caused to effect, therefore, a stable tonal reproduction can be achieved. For example, an ink cell having the same ink volume as the conventional ink cell of 2 micron depth, 175 lines and 1:2.5 line ratio, has a depth of 5 microns in the case that the half-tone dot is 20%, the deviation of 0.5 micron depth causes only 10% change to the whole cell volume. Accordingly, as compared with the above-mentioned conventional method, the latter method reduces the difficulty of etching step, in addition, it will be apparent that the controlling in the printing operation can be made easy.

In the screen gravure method applying the variation of sizes and depths of the ink cells, two positives of a gravure half-tone positive and a continuous tone positive are employed which is called as double positive method as disclosed in the above. In this process, the carbon resist is exposed to a light source by using a half-tone positive to form the half-tone dots, and further exposed by using a continuous tone positive to cause the variation of the depths of the half-tone dots, then the printing plate is obtained through the steps of transferring, developing and etching, in which it is necessary to place the half-tone positive and the continuous tone positive in a completely registered position. Accordingly, the technical skill is required owing to the above difficulties and complexity of the process, and various materials are used, so that it is economically disadvantageous and is not generally adopted.

In consideration of the above facts, the method to attain the first object of the present invention has been proposed to eliminate the above-mentioned difficulties. In this method, as the first step, a photosensitive carbon resist is exposed to a light source through a gravure screen having desired number of transparent crosslines, then in the second step, the above carbon resist is again exposed through a half-tone positive, and in the third step, a diffusion sheet is inserted between the above-mentioned half-tone positive and carbon resist used in the second step, and the half-tone positive is again printed through the diffusion sheet. Thereby, the half-tone positive performs the same function as that of a continuous tone positive. After these steps, the same steps as the conventional method are carried out to obtain a gravure printing plate having ink cells of the desired sizes and depths. In the meantime, it is well known that the formation of moire can be prevented or minimized by changing the angles of respective lines of color plates in the planographic or relief color printing.

However, in the above process, the half-tone positive (including any of planographic, relief and gravure) is combined with a gravure screen having the same or different screen lines, so that the moire pattern is liable to occur, which gives undesirable effect to the printed matters.

In order to prevent the formation of such moire, it has been ascertained that the following method for the third object of the present invention is very effective.

In the following, the method for attaining the third object of the present invention will be explained.

The half-tone positive for planographic or relief printing has generally checkered patterns as shown in FIGS. 9, 10 and 11. When the dot area is less than 50%, each half-tone dot exists separately, and when the dot area is more than 50%, the dots are linked with the adjacent dots. That is, the half-tone dots 16 in a highlight portion of 10% in dot area are shown in an enlarged scale in FIG. 9, the half-tone dots 17 in a middle tone portion of 50% in dot area are shown in FIG. 10, and the dots 18 in a shadow portion having 80% dot area are shown in FIG. 11.

In the photogravure printing, the printing operation is carried out at a high rate of speed and the viscosity of the printing ink is very low, so that all over the surface of the printing plate from the highlight portion to the shadow portion must be covered by a large number of independent ink cells.

When a half-tone positive for relief printing or planographic printing is used for the photogravure printing, the portion more than 50% density having larger half-tone dots should be provided with the walls of ink cells, however, the highlight portion has already independent half-tone dots, so that it is not necessary to provide the walls of ink cells by the gravure screen. Further, when the highlight portion is provided with such ink cell walls, the reproduction of the tone is impeded. Accordingly, the gravure screen must be made effective to the portions from the middle tone to the shadow.

As disclosed in the above, when the highlight portion is provided with the walls by using a gravure screen, the formation of moire pattern as well as the above-mentioned impediment of the tone density are caused to occur. In order to prevent this moire formation, the use of irregularly dotted or lined screen in place of the common gravure screen has been considered.

For example, when a sand-grained gravure screen is used, the loss in the tone reproduction is large and the printed surface becomes coarse because it suffers the influence of the sand-grained pattern, which is not desirable for printing. Accordingly the sand-grained gravure screen is only used for special purposes.

In the meantime, when a 5 to 10% half-tone dot pattern that is made by using a half-tone screen having fine transparent lines such as 300 lines or 600 lines per inch, is used in place of the gravure screen, the walls to support the doctor blade is formed and the formation of moire pattern and the flowing of ink can be almost prevented, however, the ink cell volume of the shadow portion is much decreased, so that the high density representation which is characteristic to the gravure printing can not be expected.

Still further, it has been found that the use of a parallel line screen in place of the crossline gravure screen does not produce any desirable result.

In general, the moire pattern is formed in the highlight to the middle tone portion in the photogravure printing. This depends upon the facts that the widths of walls in the shadow portion are much reduced by the side etching action during etching, and the printing ink is diffused and permeated into the fiber of paper by capillary action due to its low viscosity when it is printed. Further, printed ink dots are smashed to some extent on the paper by printing pressure and they are interconnected to form continuous ink film. Therefore, the regularity of the orientation of the half-tone dots is lost. Accordingly, the moire is hard to occur in the portion of the middle tone to the shadow.

Meanwhile, in the highlight portion, the side etching in the etching step is very little, and the volume of ink in each ink cells is very small as compared with that in the shadow portion, so that even the sizes of ink cells are somewhat increased, the regularity of dot shapes and their alignment can be maintained.

The first step of the method for the third object of the present invention is a screen exposure process. For example, as shown in FIG. 12, a continuous tone negative 19 having the same dimension as that of planographic, relief or gravure half-tone positive, and a gravure screen 20 are put in layers on a photosensitive carbon resist 21, then the exposure to a light source is carried out. The arrows 22 in the drawing indicate the direction of the exposure light.

In this case, the optical density of the originally highlight portion a (FIG. 12) in the continuous tone negative 19 is very high, so that the light is hardly passed through during the exposure, accordingly, the gravure screen 20 is not printed to the carbon resist 21.

Meanwhile, the optical density of the continuous tone negative 19 in the originally shadow portion b is very low, so that the pattern of the gravure screen 20 is not influenced by the continuous tone negative 19, and the screen lines are printed on the carbon resist 21. Further, in the middle tone portion c, the carbon resist 21 is provided with the light rays having the intensity in proportion to the density of the continuous tone negative 19, accordingly, the walls (screen lines) are hardly formed on the side of highlight portion a, while walls are formed on the side of shadow portion b. As the result, the formation of moire pattern can be prevented all over the portions from the highlight to the shadow, in addition, the gravure screen is effected in the portion of the middle tone c to the shadow b.

This method for attaining the third object of the present invention can also be carried out as follows. That is, as shown in FIG. 13, a half-tone negative 23 is used in place of the above-mentioned continuous tone negative 19, and a diffusion sheet 24 is inserted as a spacer under the half-tone negative 23. These sheets 23 and 24 are put on a gravure screen 20 in like manner as the foregoing step, and the layers are contacted with the carbon resist 21 to be exposed to a light source. The arrows 22 also indicate the direction of light rays.

As disclosed in the above, the above diffusion sheet 24 as a spacer has the function to separate the half-tone negative 23 and the gravure screen 20 and also to diffuse the light for exposure. Accordingly, the half-tone negative 23 acts as a continuous tone negative, and thereby the formation of moire pattern caused by the half-tone negative 23 and the gravure screen 20 can be prevented in like manner as the foregoing method.

In the second step of this method to attain the third object of the present invention, the carbon resist 21 which has been printed with using the gravure screen in the first step, is further exposed to the light source by contacting it with a half-tone positive that is used for planographic, relief or gravure printing.

As shown in the enlarged FIG. 14, as the walls are scarcely formed by the gravure screen in the highlight portion a, only the small ink cells 25 are scattered, while in the shadow portion b as shown in FIG. 15 also enlarged, large ink cells 27 defined by the walls 26 and small half-tone dots 28 are printed.

In the next third step, a diffusion sheet as a spacer is inserted between the half-tone positive and carbon resist 21 that are used in the second step, and the half-tone positive is again printed through the diffusion sheet.

When this diffusive exposure is carried out in the third step, the light passed through the portion other than the half-tone dots of the half-tone positive arrives to the half-tone dot portions on the carbon resist according to the sizes of respective half-tone dots, thus the half-tone positive functions as an approximately continuous tone positive by the gradation effect. So that, the rate of curing of the carbon resist is varied according to the density of the half-tone dots of the positive, thus the depths of half-tone dots are varied. As the result, a photogravure printing plate having ink cells of various depths can be formed through the etching process.

In the succeeding fourth step, the carbon resist exposed to the light source in the first, second and third steps is transferred on the surface of a gravure cylinder and developed, and then the gravure cylinder is etched to obtain a screen gravure printing plate. This etching step is the same as the conventional etching process using carbon resists.

It is advantageous that the negatives which are obtained in the conventional process work as intermediate products can be directly used as the continuous tone negative or half-tone negative for the method attaining the third object of the present invention, so that there is no disadvantage in view of the cost.

In accordance with the method for attaining the third object of the present invention, the highlight portion is reproduced very stably and the tone quality like the planographic printing or relief printing can be reproduced without any injury. Further, in the middle tone to shadow portion, the walls of ink cells for supporting the doctor blade are formed, so that gravure printings with a very deep color density can be produced and the formation of moire in the highlight portion can be successfully prevented.

Still further, masks other than the above-mentioned half-tone negative and half-tone positive can be used together with the gravure screen. For example, it is economical method to obtain a half-tone negative of an image having reversibility with light, heat or pressure from a half-tone positive.

According to the method of the present invention for attaining the fourth object, a gravure screen having desired number of transparent crosslines is firstly contact-printed on a photosensitive carbon resist to form the walls of ink cells in the middle tone to the shadow portion, then this carbon resist is further exposed to a light source through a planographic or relief half-tone positive which represents the tone with the variation of half-tone dots. Further, the above obtained carbon resist is again exposed through a continuous tone positive or an approximately continuous tone positive to impart the variation of the depths of half-tone dots. Lastly, thus formed carbon resist is transferred on a conventional gravure cylinder, and then it is subjected to developing and etching. Thus, the photogravure printing plate which represents the gradation of the original by the variation of sizes and depths of the half-tone dots is formed.

In the first step of this method, contact printing of a gravure screen D having desired number of transparent lines to a photosensitive carbon resist E is carried out (See FIG. 17).

The purpose of this exposure using the gravure screen D is to form walls of ink cells in the portions of the middle tone to the shadow so as to prevent the flowing of the printing ink.

In the next second step, the carbon resist E which is exposed by using the gravure screen in the first step is again exposed by contacting it with a half-tone positive A for planographic or relief printing (See FIG. 18). By using the above half-tone positive A, the tone of the original is represented by the variation of half-tone dots, and the exposure may be carried out in like manner as the foregoing first step. That is, the printing of half-tone positive in the second step is carried out for the purposes of formation of half-tone dots.

In the next third step, the carbon resist E which was printed with the half-tone positive in the second step is exposed to a light source by using a continuous tone positive B or an approximately continuous tone positive C (See FIG. 19).

In this third step, each half-tone dot is varied in its depth in addition to the size by the exposure using the continuous tone positive or the approximately continuous tone positive so as to form a gravure printing plate having the half-tone dots of different sizes and depths.

As the above-mentioned continuous tone positive B, conventional ones for gravure printing can be used, and as the approximately continuous tone positive C, a half-tone positive for planographic printing is firstly prepared in the conventional manner and thereafter it is gradated.

There are two methods for preparing this approximately continuous tone positive C.

The first method is such that a planographic half-tone positive A is contact printed to a photosensitive film to form a half-tone negative 29, and this half-tone negative 29 is then printed to another photosensitive sheet 30 with inserting a diffusion sheet 31 between them as shown in FIG. 16, thus the half-tone dots are gradated by the spacer effect of the diffusion sheet 31 to produce the approximately continuous tone positive C.

In the second method, a half-tone negative is formed by contact printing of a planographic half-tone positive A to a photosensitive film, and thus obtained half-tone negative is photographed in the state of out of forcus by using a process camera, thus the approximately continuous tone positive C in which the half-tone dots are gradated to a hardly distinguishable degree can be produced.

Both of the approximately continuous tone positives as obtained through the above methods can be used likewise.

In addition to the above, a planographic half-tone positive A prepared from the continuous tone negative B can be used for the contact printing in the aforementioned third step. In this case, the following two methods can be applied.

In one method of them, a continuous tone positive is prepared by the conventional procedure, and then the planographic half-tone positive A is produced from the above continuous tone positive by using a printer and an appropriate crossline screen. In another method, a planographic half-tone positive A is prepared by half-tone photography using a conventional process camera.

In the fourth step, the carbon resist which was treated in the preceding first, second and third steps is transferred on the surface of a gravure cylinder, and then developed and subjected to etching to form the screen gravure printing plate of the present invention.

This fourth step can be carried out in accordance with the conventional art.

In the method for attaining the fourth object of the present invention, after the printing of the gravure screen, the gradation of the original is represented by the variation of the sizes of half-tone dots formed by the printing of half-tone positive, further the same-sized continuous tone positive or an approximately continuous tone positive is printed again to impart the variation of depths as well as the sizes of the half-tone dots. So that, fine gravure prints with wide gradation can be produced.

Further, in the method of the present invention for attaining the fourth object, the planographic or relief half-tone positive A, the continuous tone positive B and the approximately continuous tone positive C for the exposure of the carbon resist are prepared separately, accordingly these positives can be retouched each time without difficulty. Therefore, the retouched positives can be used for the exposures of the carbon resist E, and thus the gradation of the original can be fully reproduced on the gravure prints.

It should be emphasized, however, that the specific embodiments described herein are intended as merely illustrative and in no way restrictive of the invention.

What is claimed is:

1. A method of screen gravure photoengraving using a half-tone positive of the planographic type or the relief type which comprises performing the separate steps of:
   (a) exposing a photosensitive resist material to a light source through a gravure screen having desired number of transparent crosslines;
   (b) exposing said photosensitive resist material to the light source through said half-tone positive of the planographic type or the relief type;
   (c) exposing said photosensitive resist material to the light source by interposing a diffusion sheet between said half-tone positive of the planographic type or the relief type and said photosensitive resist material; and
   succeeding plate making steps, in which the order of said exposing steps (a), (b) and (c) are not fixed.

2. A method of screen gravure photoengraving as claimed in claim 1, wherein said photosensitive material is a carbon resist and said succeeding plate making steps comprise the steps of:
   transferring said carbon resist on the surface of a gravure cylinder;
   developing said carbon resist; and
   etching the gravure cylinder through said carbon resist.

3. A method of screen gravure photoengraving as claimed in claim 1, wherein said photosensitive material is a gravure resist film and said succeeding plate making steps comprise the steps of:
   developing said gravure resist film with developing agents;
   transferring said gravure resist film on a gravure cylinder;
   again developing said gravure resist film with hot water; and
   etching the gravure cylinder through said gravure resist film.

4. A method of screen gravure photoengraving as claimed in claim 1, wherein said photosensitive material is a photosensitive resin layer formed on a gravure cylinder and said succeeding plate making step comprises the step of developing said photosensitive resin layer on said gravure cylinder.

5. The method of claim 1 wherein the step of exposing said photosensitive material to a light source through said gravure screen further includes the step of further placing on said gravure screen the layers of a half-tone negative and a diffusion sheet.

6. A method of screen gravure photoengraving as claimed in claim 5, wherein said layers of a half-tone negative and a diffusion sheet are replaced by a continuous tone negative.

* * * * *